US007054676B2

(12) United States Patent
Hedlund et al.

(10) Patent No.: US 7,054,676 B2
(45) Date of Patent: May 30, 2006

(54) MR-COMPATIBLE METHODS AND SYSTEMS FOR CARDIAC MONITORING AND GATING

(75) Inventors: Laurence W. Hedlund, Chapel Hill, NC (US); Anja C. S. Brau, Durham, NC (US); Charles T. Wheeler, Durham, NC (US); G. Allan Johnson, Chapel Hill, NC (US)

(73) Assignee: Duke University, Durham, NC (US)

( * ) Notice: Subject to any disclaimer, the term of this patent is extended or adjusted under 35 U.S.C. 154(b) by 730 days.

(21) Appl. No.: 09/840,029

(22) Filed: Apr. 24, 2001

(65) Prior Publication Data

US 2002/0156371 A1    Oct. 24, 2002

(51) Int. Cl.
*A61B 5/05*    (2006.01)

(52) U.S. Cl. ..................................... 600/413
(58) Field of Classification Search ............... 600/413, 600/410, 407, 428, 425, 421; 324/307, 308, 324/309
See application file for complete search history.

(56) References Cited

U.S. PATENT DOCUMENTS

| | | | | |
|---|---|---|---|---|
| 4,739,766 A | * | 4/1988 | Riederer | 600/413 |
| 4,991,587 A | * | 2/1991 | Blakeley et al. | 600/483 |
| 5,273,041 A | * | 12/1993 | Richards et al. | 600/411 |
| 6,023,162 A | * | 2/2000 | Johnson | 324/300 |
| 6,076,005 A | * | 6/2000 | Sontag et al. | 600/413 |
| 6,094,591 A | * | 7/2000 | Foltz et al. | 600/419 |
| 6,595,987 B1 | * | 7/2003 | Negus et al. | 606/14 |
| 6,731,967 B1 | * | 5/2004 | Turcott | 600/407 |

OTHER PUBLICATIONS

Electrocardiogram Acquisition during MR Examinations for Patent Monitoring and Sequence Triggering; Jacques Felblinger, Christoph Lehmann, Chris Boesch; pp. 523-529.
A simple Fiber Optic Monitor of Cardiac and Respiratory Activity for Biomedical Magnetic Resonance Applications; J.P. Legendre, R. Misner, G.V., Forester, and Y. Geoffrion; pp. 953-957.
MR-compatible ventilator for small animals: computer-controlled ventilation for proton and noble gas imaging; Laurence W. Hedlund, Gary P. Cofer, Steven J. Owen, G. Allan Johnson; pp. 753-759.

(Continued)

*Primary Examiner*—Daniel Robinson
(74) *Attorney, Agent, or Firm*—Nixon & Vanderhye, P.C.

(57) ABSTRACT

Noninvasive, MR-compatible methods and systems optically detect mechanical cardiac activity by anatomic (e.g., esophageal) movements. Most preferably, esophageal motion is detected optically and is indicative rhythmic cardiac activities. This esophageal motion may then be detected and used to provide a signal indicative of periods of cardiac activity and inactivity. The signal may be further processed so as to generate a trigger signal that may be input to a MR scanner. In such a manner, MR microscopy may be accomplished to acquire information at a specific phase of the cardiac cycle, for example, in synchrony with periods of cardiac inactivity. Moreover, since mechanical cardiac activity is detected and employed, instead of electrical activity as is employed in conventional techniques, the present invention is immune to electromagnetic interference during MR microscopy. As a result, robust cardiac signals may be monitored and gated during 2-dimensional and 3-dimensional in vivo microscopy. The present invention is therefore especially well suited for MR microscopy of small animals, such as laboratory mice and rats.

Figure 1:
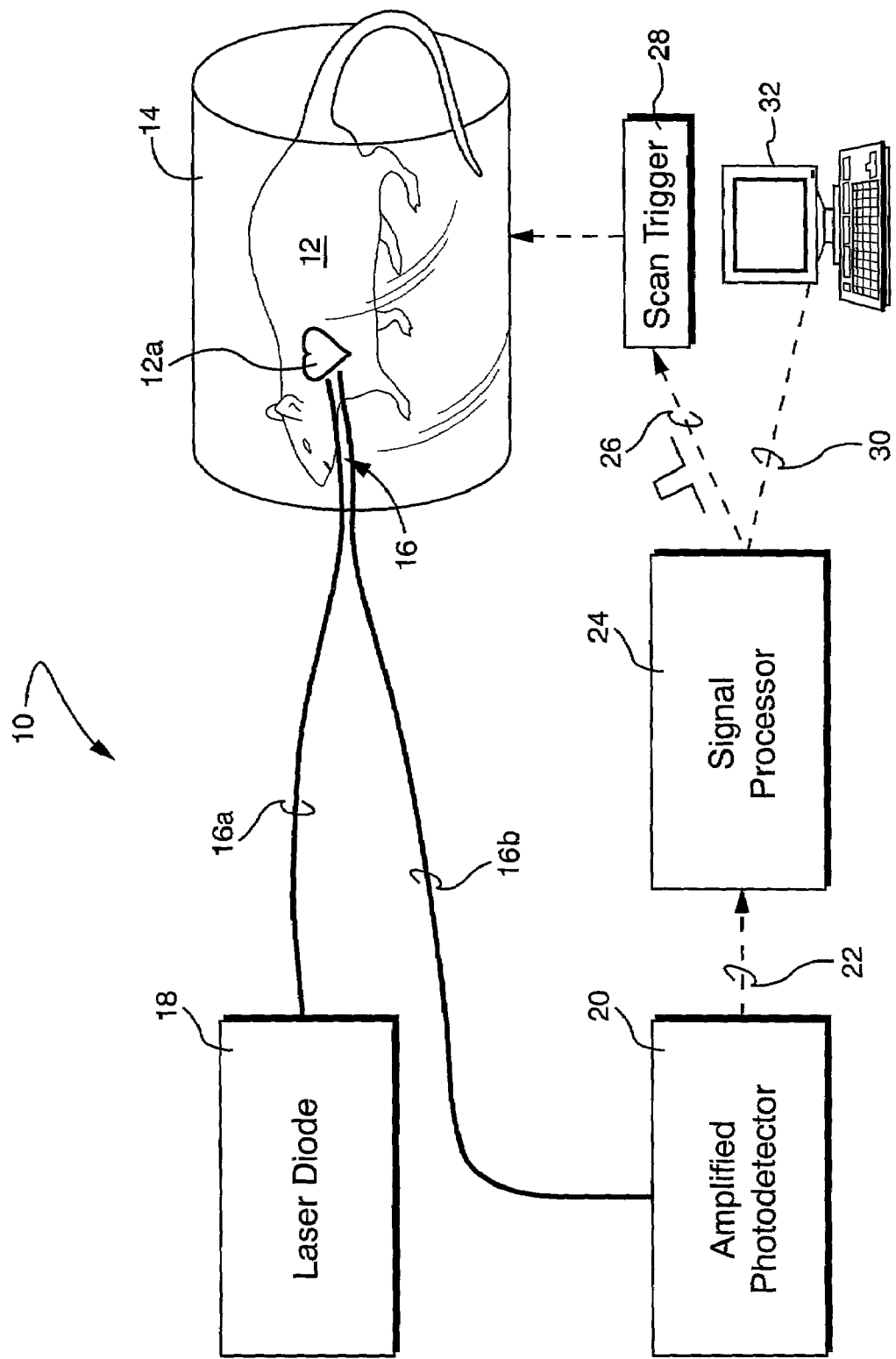

23 Claims, 3 Drawing Sheets
(1 of 3 Drawing Sheet(s) Filed in Color)

OTHER PUBLICATIONS

Monitoring of respiratory and heart rates using a fibre-optic sensor; L.G. Lindberg, H. Ugnell, P.A. Oberg; Department of Biomedical Engineering, University of Linkoping, Linkoping, Sweden; pp. 533-537.

Brau ACS, Wheeler CT, Hedlund LW, Johnson GA. *Fiber-Optic Stethoscope: A Cardiac Monitoring and Gating System for Magnetic Resonance Microscopy*. Magn Reson Med 47(2): 314-321, 2002.

* cited by examiner

MR-COMPATIBLE METHODS AND SYSTEMS FOR CARDIAC MONITORING AND GATING

GOVERNMENT RIGHTS STATEMENT

This invention was made with Government support under Grant No. NIH NCRR #P41 RR05959 awarded by the National Institutes of Health. The Government has certain rights to the invention.

FIELD OF THE INVENTION

The present invention relates generally to the field of magnetic resonance (MR) imaging. More specifically, the present invention relates to systems and methods for reliably monitoring and gating cardiac activity in patients during MR microscopy.

BACKGROUND AND SUMMARY OF THE INVENTION

A fundamental problem associated with using a conventional electrocardiograph (ECG) to monitor a patient's cardiac activity during MR imaging is the corruption of the ECG signal due to adverse electromagnetic effects. This effect is particularly pronounced in MR microscopy of small animals (e.g., laboratory rodents), where strong, rapidly-switching, magnetic field gradients are needed to obtain high spatial and temporal resolution, and the animal's ECG signal is less than a millivolt in amplitude. The spurious signals often resemble the QRS spike and can lead to erroneous cardiac gating. Furthermore, the artifacts often do not disappear until tens of milliseconds after the gradients turn off.

Several methods have been proposed to improve the quality of the ECG, and alternative measures of cardiac activity have been suggested. See, Felblinger et al, *Magn. Res. Med.*, 32, 523–529 (1994); Lindberg et al, *Med. Bio. Eng. Comp.*, 30, 533–537 (1992); and Legendre et al, *Magn. Res. Med.*, 3, 953–957 (1986), the entire contents of each being incorporated hereinto expressly by reference. However, none of these conventional methods has been shown to provide reliable monitoring and gating ability in small rodents during cardiac MR microscopy. It is therefore towards fulfilling such a need that the present invention is directed.

Broadly, the present invention is embodied in noninvasive, MR-compatible methods and systems whereby mechanical cardiac activity is detected optically by movements in the esophagus and/or other anatomic structures affected by cardiac activity, such as, for example, the chest wall or blood vessels. More specifically, according to a particularly preferred embodiment of the present invention, esophageal compressions are used as a proxy for rhythmic cardiac activities. These esophageal compressions may be detected to provide a signal indicative of periods of cardiac activity and inactivity. The signal may be further processed so as to generate a trigger signal that may be input to a MR scanner. In such a manner, MR microscopy may be accomplished in such a manner so as to record images at desired specific phases of the cardiac cycle, for example to record images in synchrony with periods of cardiac inactivity. Moreover, since mechanical cardiac activity is detected and employed (i.e., by detecting physical movements in the esophagus and/or other anatomic structures affected by cardiac activity), instead of electrical activity as is employed in conventional techniques, the present invention is immune to electromagnetic interference during MR microscopy. As a result, robust cardiac signals may be monitored and gated during 2-dimensional and 3-dimensional in vivo microscopy. The present invention is therefore especially well suited for MR microscopy of small animals, such as laboratory mice and rats.

These aspects, as well as others, will become more clear after careful consideration is given to the following detailed description of the preferred exemplary embodiments.

BRIEF DESCRIPTION OF THE ACCOMPANYING DRAWINGS

The patent or application file contains at least one drawing executed in color. Copies of this patent or patent application publication with color drawing(s) will be provided by the Office upon request and payment of the necessary fee.

Figure 2:
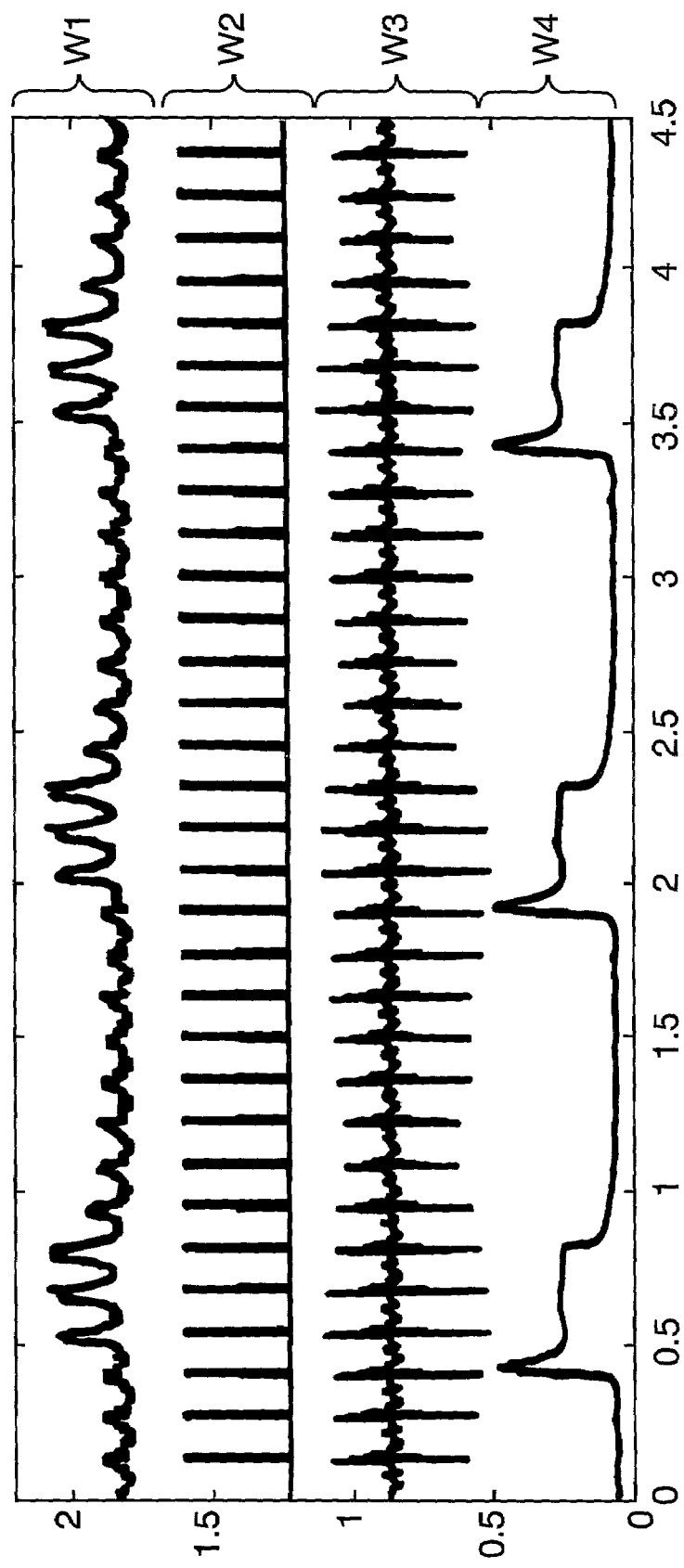
Figure 3A:
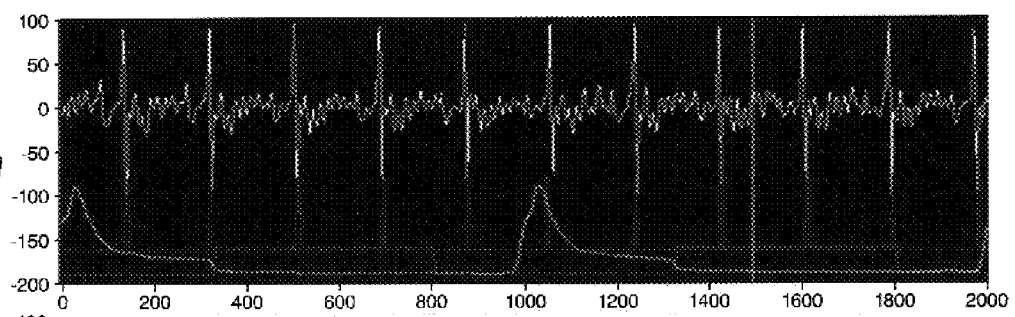
Figure 3B:
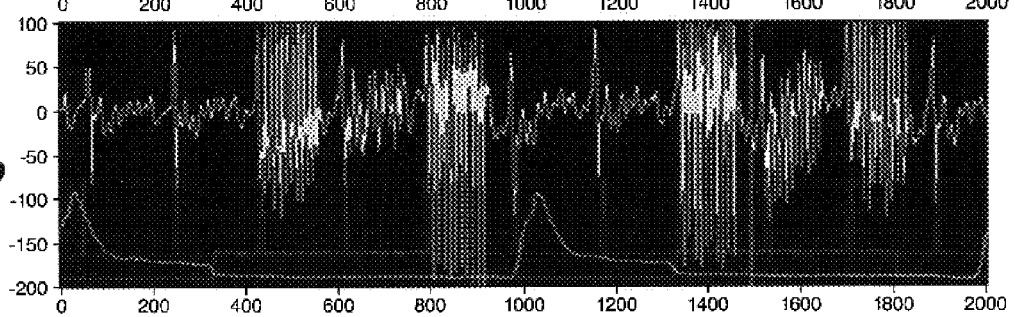

The present invention will be described with reference to the following drawings, wherein:

FIG. 1 is a schematic view of a presently preferred system in accordance with the present invention;

FIG. 2 is a trace of waveforms for the detected optical signal, corresponding gating pulses, ECG and airway pressure obtained from the procedures of the Example below; and FIGS. 3a and 3b are respective color screen saves of a physiologic monitor taken during fiber optic-gated, CINE cardiac MR microscopy obtained from the procedures of the Example below with the imaging gradients turned on and off, respectively.

DETAILED DESCRIPTION OF THE INVENTION

Accompanying FIG. 1 depicts a presently preferred system 10 in accordance with the present invention, which is depicted, in an exemplary fashion, for use with a small laboratory animal, such as a mouse 12. As is well known to those in this art, the mouse 12 may be positioned within a magnet 14 associated with a magnetic resonance (MR) scanner.

The mouse 12 is intubated to insure a patent airway. An optical probe assembly 16 is inserted into the mouse's esophagus. The probe assembly 16 is most preferably comprised of at least transmit and receive optical fibers 16a, 16b, respectively. The distal end of the probe assembly 16 is positioned so as to be at a site physically within the mouse's esophagus adjacent the heart (schematically depicted in FIG. 1 and identified therein by reference numeral 12a).

A laser diode 18 supplies laser light to the transmit optical fiber 16a so as to illuminate the site of the mouse's esophagus adjacent the distalmost end of the optical probe assembly 16. Light reflected from that esophagus site is then received by the optical fiber 16b and directed to an amplified photodetector 20 optically coupled thereto. The photodetector derives an output signal 22 from the reflected light, which is indicative of cardiac heart beats (that is, the rhythmic periods of cardiac activity and inactivity). The output signal 22 is further processed by signal processor 24 so as to supply a trigger signal 26 to a scan trigger 28 operatively coupled to the computer system associated with the MR scanner. The trigger signal 26 thus causes the scan trigger to initiate a MR scan pulse when the output signal 22 indicates a period of cardiac inactivity. Alternatively, the trigger signal 26 can be stored with the acquired MR data for use in post-processing methods to yield a series of dynamic images demonstrating the heart at varied phases of the cardiac cycle. The signal processor 24 may also supply a monitoring signal 30 to a physiologic monitor 32.

The present invention will be further described with reference to the following non-limiting Example.

EXAMPLE

A system 10 as shown in FIG. 1 was employed. Specifically, two 5-m step-index multimode optical fibers (Thorlabs, Newton, N.J.) were used as the transmit and receive optical fibers 16a, 16b, respectively. The last 10 cm of each fiber was stripped of buffer, and the bare fibers were bundled together for total diameter of 250 microns. The fiber tips were cleaved at appropriate angles to maximize light detection. Light from a collimated 40 mW, 650 nm laser diode (Thorlabs), selected for its minimal tissue absorption, was focused into the transmit fiber 16a using an optical lens.

Twenty-eight rats (150 g–250 g) and one C57 mouse (40 g) were intubated and anesthetized with isoflurane delivered b ventilator as described more fully in Hedlund et al, *Magn. Res. Img.*, 18, 753–759 (2000), the entire content of which is expressly incorporated hereinto by reference. Pediatric electrodes were taped to the animal's footpads to acquire a reference ECG signal. Average heart rates were 300 bpm for the rat and 400 bpm for the mouse. The bundled fiber optic probe 16 was easily inserted down the animal's esophagus to the mid-chest level with the aid of a tapered catheter oriented towards the heart.

As light from the transmit fiber impinged upon the esophageal wall, the amount of reflected and scattered light detected by the second fiber 16b varied over the cardiac cycle as a result of systolic contraction. The optical signal was conveyed to an amplified photodetector 20 (Thorlabs), and the electrical signal was passed to a signal processor 24, which generated a 5 ms trigger pulse on the falling-edge of the detected signal for cardiac gating. The circuit also included an adjustable lockout period to reject arrhythmias or other spurious pulses. The optical signals were displayed on a physiologic monitor along with ECG and airway pressure waveforms. All imaging was preformed on a 2.0 T magnet (Oxford Instruments, Oxford, UK) with a 7-cm diameter radio frequency (RF) coil.

Accompanying FIG. 2 shows, from top to bottom, the waveforms for the detected optical signal (W1), the corresponding gating pulses (W2), the ECG (W3) and the airway pressure (W4) in a rat. The periodic variations in the detected optical signal arise from reflection of the laser from the esophageal wall and the heart. The variations are greatest during inspiration, when the lungs occupy the largest volume and further compress the esophagus. The cardiac gating pulses clearly match the frequency of the ECG, joining up perfectly with the QRS spike.

Screen saves of the physiologic monitor taken during fiber optic-gated, CINE cardiac MR microscopy are shown in accompanying FIGS. 3a and 3b, and demonstrate the utility of the system 10 in accordance with the present invention as compared to conventional ECG. In this regard, the traces shown in FIG. 3a were obtained with the imaging gradients off and the gating pulses are coincident with the QRS spike of the ECG. In contrast, however, in FIG. 3b, imaging gradients were turned on and the ECG trace is visibly corrupted by induced voltages, while the fiber optically derived signals from the system of the present invention is unaffected and continues to provide a reliable cardiac signal.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for detecting a phase in a cardiac cycle comprising the steps of:
    (a) optically detecting movements of an anatomic structure affected by cardiac activity;
    (b) deriving a cardiac signal in response to said optically detected movements which is indicative of a phase in a cardiac cycle; and
    (c) generating a trigger signal in response to said derived cardiac signal which is indicative of said phase of the cardiac cycle.

2. The method of claim 1, wherein step (a) is practiced by inserting an optical fiber esophageal probe into an esophagus.

3. The method of claim 2, which comprises directing laser light onto a site within the esophagus through at least one optical fiber in the probe, and receiving reflected light from said esophagus site through at least one other optical fiber in the probe.

4. The method of claim 3, which comprises directing said reflected light to a photodetector which derives said cardiac signal therefrom.

5. The method of claim 4, which comprises receiving the derived cardiac signal from said photodetector and generating said trigger signal therefrom.

6. A method of conducting magnetic resonance (MR) microscopy comprising the steps of:
    (a) optically detecting internal anatomic physical movement in response to rhythmic periods of cardiac activity and inactivity during a cardiac cycle;
    (b) conducting MR microscopy during said periods of cardiac inactivity; and
    (c) using the derived cardiac signal to produce cardiac images at specific phases of the cardiac cycle.

7. The method of claim 6, wherein step (a) includes deriving a cardiac signal indicative of said rhythmic periods of cardiac activity and inactivity.

8. The method of claim 7, wherein step (a) further includes generating a trigger signal in response to said derived cardiac signal of said periods of cardiac inactivity.

9. The method of claim 6, wherein step (a) includes generating a trigger signal in response to said optically detected periods of cardiac inactivity.

10. The method of claim 6, wherein step (a) is practiced by inserting an optical fiber esophageal probe into the esophagus.

11. The method of claim 10, wherein step (a) is practiced by optically detecting esophageal movements indicative of said periods of cardiac activity and inactivity.

12. The method of claim 11, comprising directing laser light onto a site within the esophagus through at least one optical fiber in the probe, and receiving reflected light from said esophagus site through at least one other optical fiber in the probe.

13. The method of claim 12, which comprises directing said reflected light to a photodetector which derives said cardiac signal therefrom.

14. The method of claim 13, which comprises processing the derived cardiac signal by receiving the derived cardiac signal from said photodetector and generating said trigger signal therefrom.

15. A magnetic resonance (MR) microscopy method comprising the steps of:

(a) inserting an optical fiber probe into a vertebrate esophagus;
(b) illuminating a site of the esophagus with light emitted by said probe;
(c) detecting reflected light from the esophagus site by a photodetector coupled optically to said probe;
(d) determining movements of the esophagus at said site indicative of rhythmic periods of cardiac activity and inactivity based on said detected reflected light and generating an output signal therefrom; and
(e) providing said output signal to a MR scanner and synchronizing MR microscopy in response to said detected periods of cardiac inactivity.

16. The method of claim 15, wherein the vertebrate esophagus is the esophagus of a laboratory animal.

17. The method of claim 16, wherein the laboratory animal is a rodent.

18. A method of conducting magnetic resonance (MR) microscopy using a MR microscopy unit, said method comprising the steps of:
(a) deriving a cardiac signal indicative of rhythmic periods of cardiac activity and inactivity by optically detecting internal anatomic physical movement in response to rhythmic periods of said cardiac activity and inactivity during a cardiac cycle;
(b) generating a trigger signal in response to said derived cardiac signal being indicative of said periods of cardiac inactivity; and
(c) operating the MR microscopy unit in response to receiving said trigger signal so that MR microscopy is conducted only during said periods of cardiac inactivity.

19. The method of claim 18, wherein step (a) is practiced by inserting an optical fiber esophageal probe into the esophagus and operating the esophageal probe to derive said cardiac signal.

20. The method of claim 19, wherein step (a) is practiced by optically detecting esophageal movements indicative of said periods of cardiac activity and inactivity.

21. The method of claim 20, comprising directing laser light onto a site within the esophagus through at least one optical fiber in the probe, and receiving reflected light from said esophagus site through at least one other optical fiber in the probe.

22. The method of claim 21, which comprises directing said reflected light to a photodetector which derives said cardiac signal therefrom.

23. The method of claim 22, which comprises processing the derived cardiac signal by receiving the derived cardiac signal from said photodetector and generating said trigger signal therefrom.

* * * * *